(12) United States Patent
Zhu et al.

(10) Patent No.: US 7,307,419 B2
(45) Date of Patent: Dec. 11, 2007

(54) METHOD AND SYSTEM FOR SPATIAL-SPECTRAL EXCITATION BY PARALLEL RF TRANSMISSION

(75) Inventors: Yudong Zhu, Clifton Park, NY (US); Christopher Judson Hardy, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 135 days.

(21) Appl. No.: 11/017,489

(22) Filed: Dec. 20, 2004

(65) Prior Publication Data
US 2006/0132133 A1 Jun. 22, 2006

(51) Int. Cl.
*G01V 3/00* (2006.01)
(52) U.S. Cl. ...................... 324/307; 324/309
(58) Field of Classification Search ........ 324/300–322; 600/407–435
See application file for complete search history.

(56) References Cited

U.S. PATENT DOCUMENTS

| | | | |
|---|---|---|---|
| 4,999,580 A | | 3/1991 | Meyer et al. |
| 5,283,526 A | * | 2/1994 | Spielman et al. ........... 324/309 |
| 5,539,313 A | * | 7/1996 | Meyer ........................ 324/309 |
| 5,999,839 A | * | 12/1999 | Hardy et al. ................ 600/413 |
| 6,304,084 B1 | * | 10/2001 | Star-Lack et al. ........... 324/307 |
| 6,549,799 B2 | * | 4/2003 | Bock et al. ................. 600/422 |
| 6,710,686 B2 | * | 3/2004 | Mertelmeier et al. ....... 324/314 |
| 6,838,879 B2 | * | 1/2005 | Kouwenhoven ............ 324/309 |
| 6,930,481 B2 | * | 8/2005 | Okamoto et al. ........... 324/318 |
| 6,989,673 B2 | * | 1/2006 | Zhu ........................... 324/318 |
| 7,034,530 B2 | * | 4/2006 | Ahluwalia et al. .......... 324/309 |
| 7,053,618 B2 | * | 5/2006 | Zhu ........................... 324/318 |
| 7,174,200 B2 | * | 2/2007 | Salerno et al. .............. 600/420 |
| 2003/0214294 A1 | | 11/2003 | Zhu |

* cited by examiner

*Primary Examiner*—Brij Shrivastav
*Assistant Examiner*—Dixomara Vargas
(74) *Attorney, Agent, or Firm*—Jean K. Testa; Curtis B. Brueske

(57) ABSTRACT

A magnetic resonance imaging (MRI) system and method is provided. The MRI system comprises a plurality of transmit coils arranged spatially distinct from each other and configured for inducing a nuclear magnetic resonance (NMR) excitation. The NMR excitation is selective both in spatial dimensions and in a chemical shift spectrum. The plurality of transmit coils are driven by a plurality of radio frequency (RF) pulses, and a gradient module is driven by a plurality of gradient pulses.

21 Claims, 4 Drawing Sheets

METHOD AND SYSTEM FOR SPATIAL-SPECTRAL EXCITATION BY PARALLEL RF TRANSMISSION

BACKGROUND

This invention relates generally to magnetic resonance imaging (MRI), and more particularly, to transmit coil arrays used in MRI.

Generally, MRI is a well-known imaging technique. A conventional MRI device establishes a homogenous magnetic field, for example, along an axis of a person's body that is to undergo MRI. The homogeneous magnetic field conditions the interior of the person's body for imaging by aligning the nuclear spins of nuclei (in atoms and molecules forming the body tissue) along the axis of the magnetic field. If the orientation of the nuclear spin is perturbed out of alignment with the magnetic field, the nuclei attempt to realign their nuclear spins with an axis of the magnetic field. Perturbation of the orientation of nuclear spins may be caused by application of radio frequency (RF) pulses. During the realignment process, the nuclei precess about the axis of the magnetic field and emit electromagnetic signals that may be detected by one or more coils placed on or about the person.

The frequency of the magnetic resonance (MR) signal emitted by a given precessing nucleus depends on the strength of the magnetic field at the nucleus' location. As is well known in the art, it is possible to distinguish radiation originating from different locations within the person's body by applying a field gradient to the magnetic field across the person's body. For the sake of convenience, direction of this field gradient may be referred to as the left-to-right direction. Radiation of a particular frequency may be assumed to originate at a given position within the field gradient, and hence at a given left-to-right position within the person's body. The application of such a field gradient is also referred to as frequency encoding.

However, the application of a field gradient does not allow for two-dimensional resolution, since all nuclei at a given left-to-right position experience the same field strength, and hence emit radiation of the same frequency. Accordingly, the application of a frequency-encoding gradient, by itself, does not make it possible to discern radiation originating from the top versus radiation originating from the bottom of the person at a given left-to-right position. Resolution has been found to be possible in this second direction by application of gradients of varied strength in a perpendicular direction to thereby perturb the nuclei in varied amounts. The application of such additional gradients is also referred to as phase encoding.

Frequency-encoded data sensed by the coils during a phase encoding step is stored as a line of data in a data matrix known as the k-space matrix. Multiple phase encoding steps are performed in order to fill the multiple lines of the k-space matrix. An image may be generated by using various imaging applications where a Fourier transformation of the k-space matrix is performed to convert frequency information to spatial information representing the distribution of nuclear spins or density of nuclei of the image material.

In many imaging applications, examination of the object with spatial-spectral selectivity (that is, imaging a particular spectral component in a particular region-of-interest) is desired in order to meet both clinical needs (such as water/fat imaging for examining atherosclerotic plaques and reduced-FOV imaging for accelerating scans) as well as quality requirements (for example, reduction of image artifacts due to frequency shifts in SSFP and fast GRE sequences).

To induce spatial-spectral selectivity, nuclear magnetic resonance (NMR) excitation that induces transverse magnetization to all spins of a prescribed Larmor frequency range in a prescribed region of interest can be used. However, with existing methods where a volume transmit coil that effects a relatively uniform RF field (e.g., a birdcage coil with quadrature driving) is used for RF transmission, an NMR excitation that achieves spatial-spectral selectivity often involves intensified pulsing activity, which require powerful gradients to keep pulse duration in check. On clinical scanners limitations in gradient strength or switching rate usually render impractical the use of spatial-spectral pulses that are selective along multiple spatial dimensions.

What is needed is a method and system to enable acceleration of multi-dimensional spatial spectral selective pulses during excitation.

BRIEF DESCRIPTION

Briefly, in one embodiment of the invention, a magnetic resonance imaging (MRI) system is provided. The MRI system comprises a plurality of radio frequency (RF) transmit coils and a gradient module. The plurality of RF transmit coils are arranged spatially distinct from each other and configured for inducing a nuclear magnetic resonance (NMR) excitation, the NMR excitation being selective both in spatial dimensions and in the chemical shift spectrum. The plurality of transmit coils are driven by a plurality of radio frequency (RF) pulses concurrently with gradient pulses applied to the gradient module.

In another embodiment, a method for magnetic resonance imaging (MRI) is provided. The method comprises controlling respective currents in multiple transmit coils to induce a nuclear magnetic resonance (NMR) excitation over a selected spatial region of an object and a selected band of resonance frequencies.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
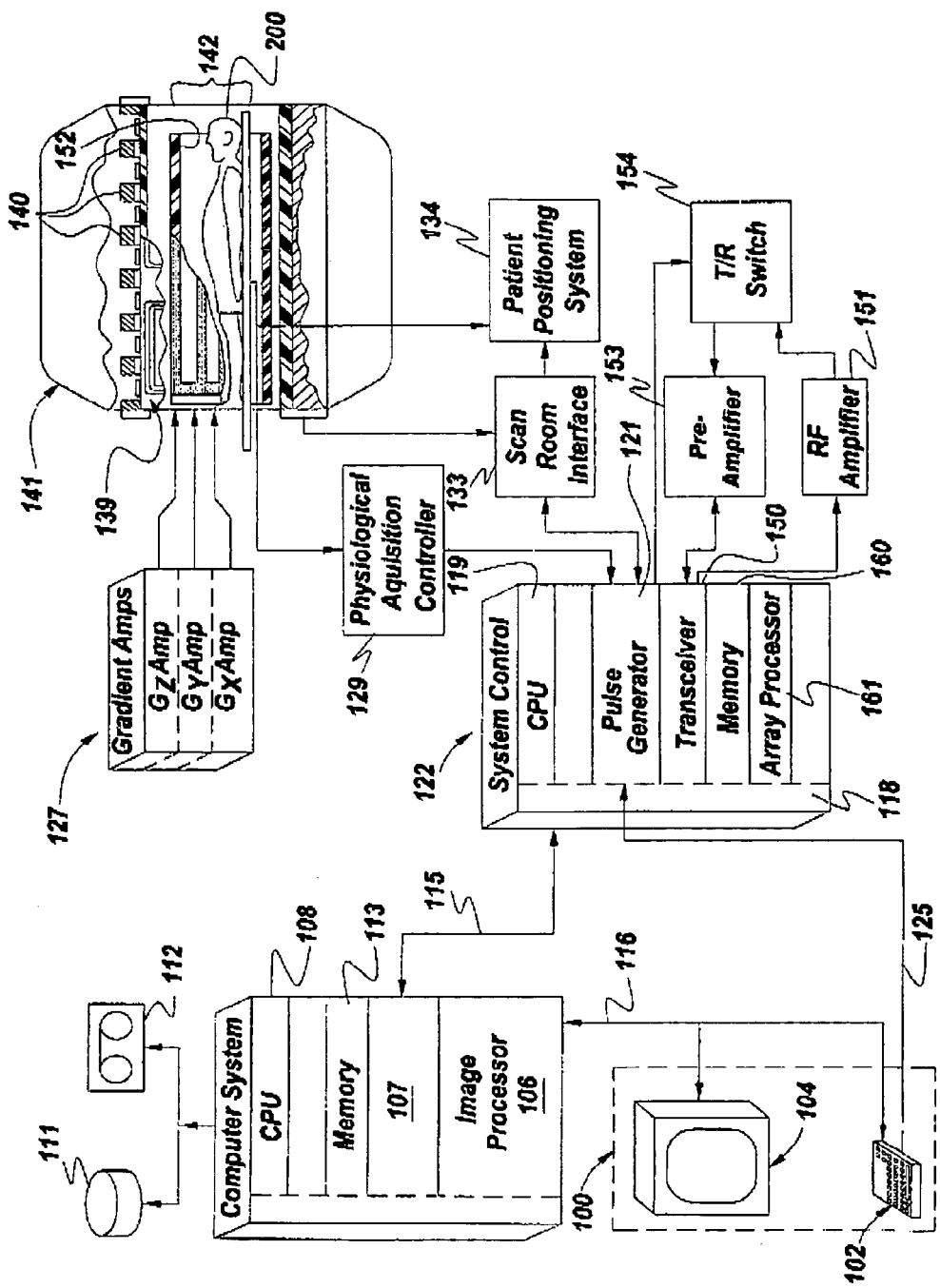
FIG. 1 illustrates a simplified block diagram of a Magnetic Resonance Imaging system to which embodiments of the present invention are useful.

FIG. 1 illustrates a simplified block diagram of a system for producing images in accordance with embodiments of the present invention. In an embodiment, the system is an MR imaging system that incorporates embodiments of the present invention. The MR system is adapted to perform the method of the present invention, although other systems could be used as well.

The operation of the MR system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108, and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 connected to the operator console 100 through a serial link 125. It is through this link 125 that the system control 122 receives commands from the operator that indicate the scan sequence that is to be performed.

The pulse generator module 121 operates the system components to carry out the desired scan sequence. It produces data that indicate the timing, strength, and shape of the radio frequency (RF) pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives subject data from a physiological acquisition controller 129 that receives signals from a number of different sensors connected to the subject 200, such as ECG signals from electrodes or respiratory signals from a bellows. And finally, the pulse generator module 121 connects to a scan room interface circuit 133 which receives signals from various sensors associated with the condition of the subject 200 and the magnet system. It is also through the scan room interface circuit 133 that a positioning device 134 receives commands to move the subject 200 to the desired position for the scan.

Figure 2:
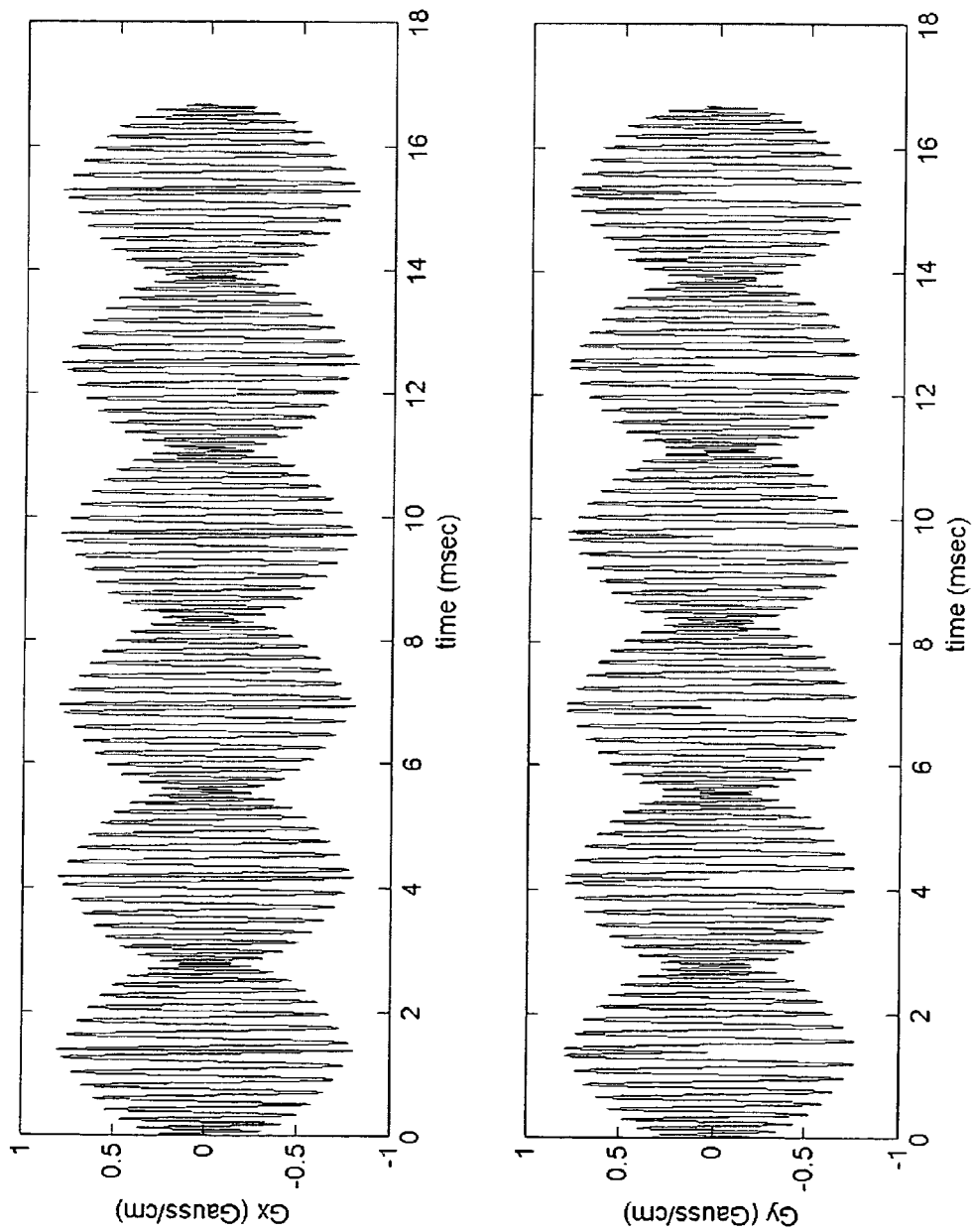
FIG. 2 is a graph illustrating exemplary gradient pulses that are used in an embodiment of an MRI system.

The gradient waveforms produced by the pulse generator module 121 are applied to a gradient amplifier system 127 comprised of Gx, Gy and Gz amplifiers. Each gradient coil is excited by a corresponding gradient pulse to produce the magnetic field gradient used for spatial encoding during RF transmission and signal acquisition. The gradient pulses driving the Gx and Gy coils during RF transmission are illustrated in FIG. 2.

Figure 3:
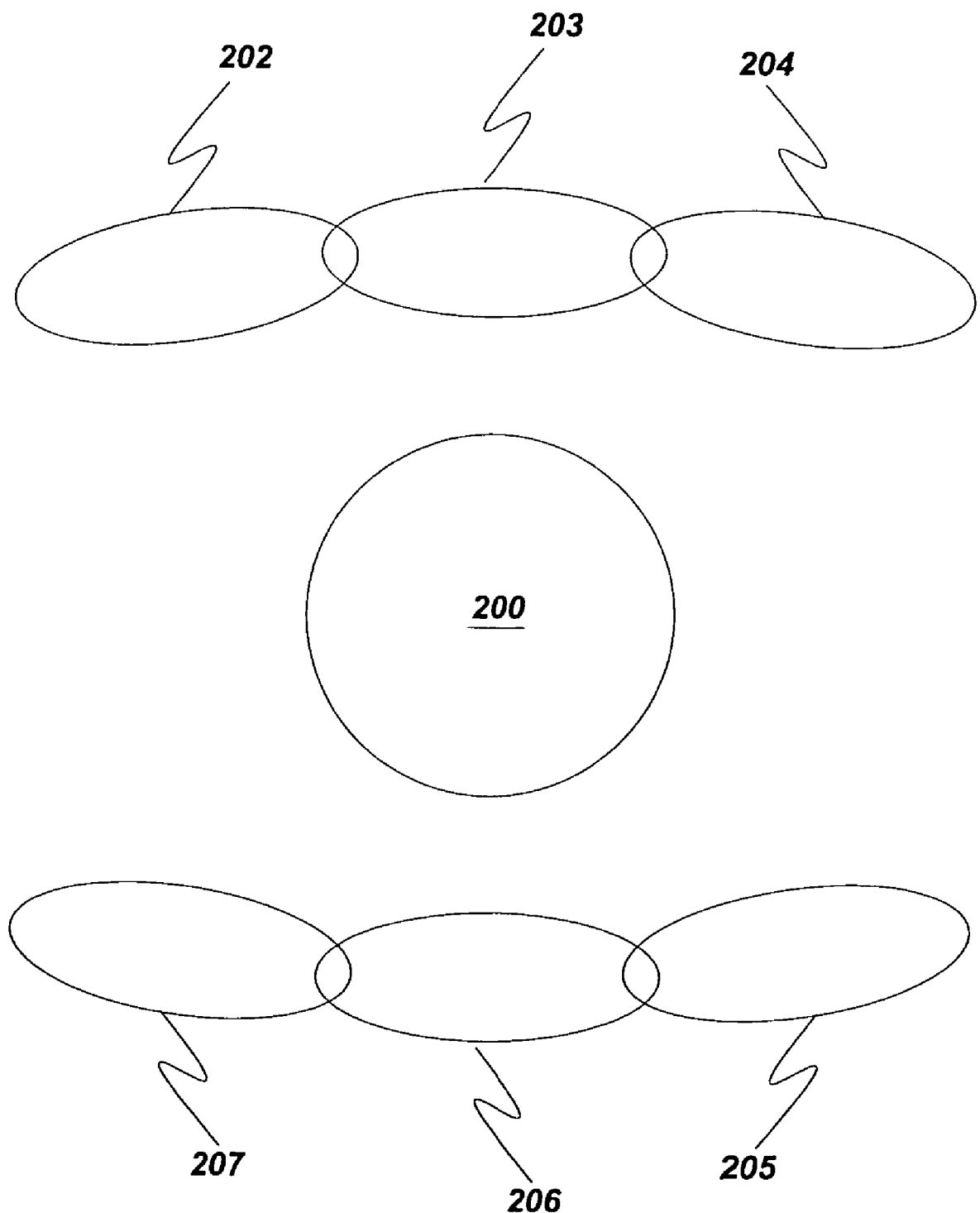
FIG. 3 is diagrammatic view illustrating one manner in which transmit coils are arranged around an object.

Continuing with FIG. 1, the gradient module 139 forms part of a magnet assembly 141, which includes a polarizing magnet 140, and a RF coil system 152. In one embodiment, the RF coil system 152 comprises a plurality of transmit coils arranged spatially distinct from each other. The manner in which the transmit coils 202-207 are arranged around object 200 is illustrated in FIG. 3.

The transmit coils are configured for inducing a nuclear magnetic resonance (NMR) excitation on a region of interest on object 200. The transmit coils are driven by a plurality of radio frequency (RF) pulses generated by pulse generator 121. In embodiments of the present invention, the RF pulses and the gradient pulses are configured to realize a spatial-spectral selectivity.

For example, an NMR excitation is applied to achieve selectivity in (x, y, f) (i.e., selective along x axis, y axis, and chemical shift frequency) with the conventional method of volume coil transmit. It is understood, based on the k-space interpretation of selective excitation, that the constant-rate traversing with time in the $k_f$ direction calls for oscillation of spatial-selection gradients, as an adequate sampling of ($K_x$, $k_y$, $k_f$) space requires repeated traversing of appropriate ($K_x$, $k_y$) neighborhoods during the course of the RF pulse. The number of repetitions or oscillations, which can be substantial in cases involving adequate spectral selectivity profiles, implies multi-fold increase in pulse length compared to that of a counter-part non-spectral pulse. This, compounded with the time-consuming ($k_x$,$k_y$) traversing with the conventional method, typically leads to a prohibitively long 3D pulse that has very limited clinical utility.

In one embodiment of the invention, the oscillation of spatial-selection gradients is maintained whereas the ($k_x$, $k_y$) traversing is substantially accelerated through sampling density reduction, which results in reduction of the overall pulse length. An appropriate design of the parallel RF pulses works with the spatial domain weighting (due to the B1 patterns associated with the multiple transmit elements) and the aliasing pattern (as determined by the pulsing gradient) to cause the reduction or annihilation of aliasing lobes' net amplitudes with the present parallel excitation approach.

Figure 4:
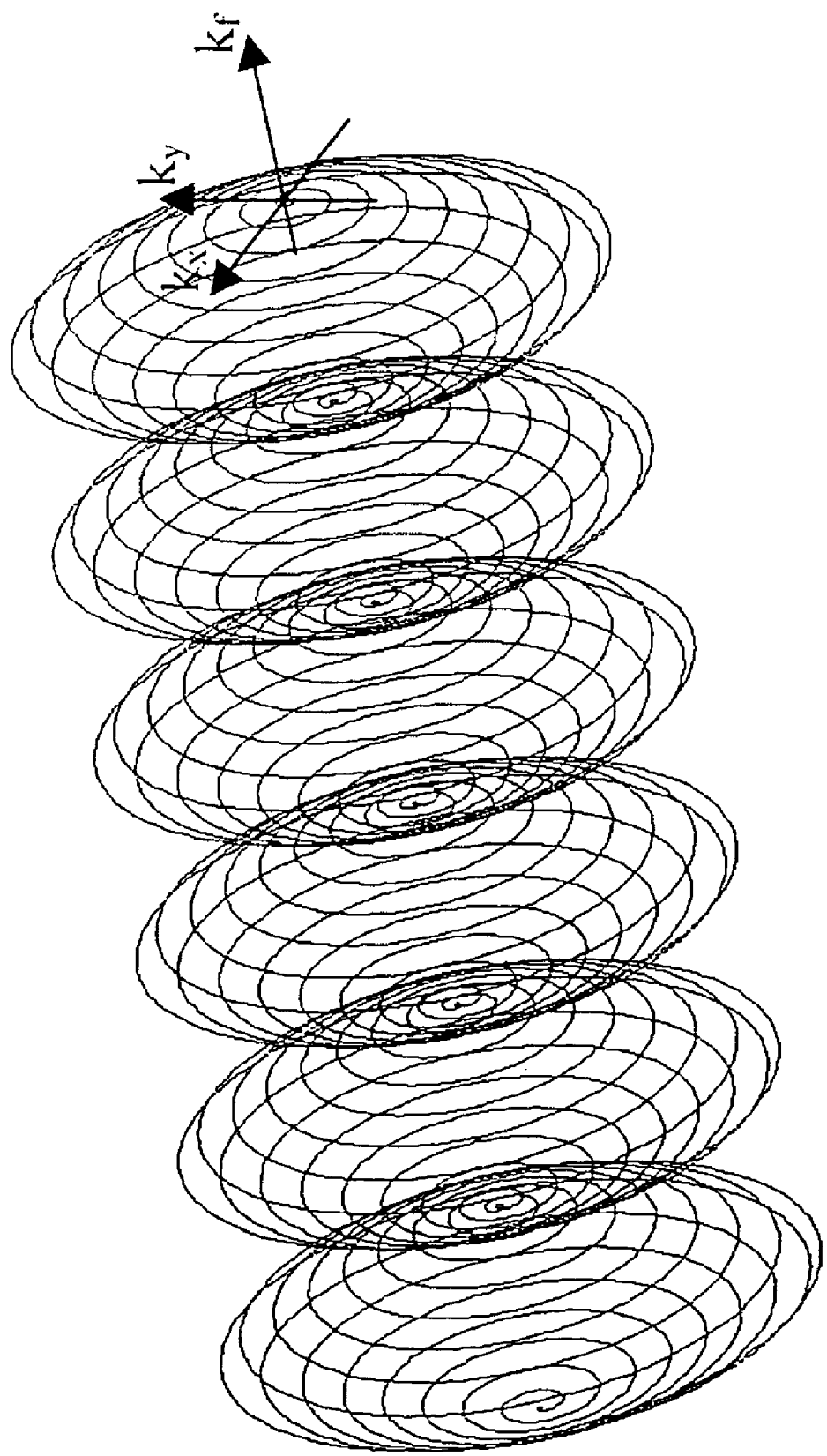
FIG. 4 is a graph illustrating a k-space trajectory according to one aspect of the invention.

FIG. 4 illustrates one exemplary k-space sampling scheme for the invention. The ($k_x$, $k_y$, $K_f$) space is traversed at a constant rate along $k_f$ while with repeated spiral in and out across $K_x$-$k_y$. Same to a design with the conventional single-coil transmit approach, the extent of the spiral matches resolution requirement on the spatial selectivity profile. On the other hand, the sampling density across $K_x$-$k_y$ required of the spiral is substantially reduced with the support of the parallel transmit coils. The reduction offsets the increase in pulse-length due to the repetition along $k_f$ and offers an effective control over the total length of the 3D pulse. Other example of the spiral scheme include repeated radial scanning across $k_x$-$k_y$, etc.

In a specific embodiment of the present invention, RF pulse and gradient pulses induce NMR excitation so as to accelerate K-space sampling along one spatial-frequency axis. In another embodiment, the RF pulse and gradient pulse induce NMR excitation so as to accelerate K-space sampling along two spatial-frequency axes. In an alternate embodiment the RF pulse and gradient pulses induce NMR excitation so as to accelerate K-space sampling along three spatial-frequency axes.

The RF pulses are further configured to allow k-space sampling density reduction along spatial-frequency axes. The reduction of sampling density results in accelerated k-space traversing of the RF pulses. The accelerated k-space traversing of RF pulses reduces an overall pulse length of the RF pulses. A k-space trajectory if viewed in two spatial-frequency dimensions, assumes a repeated spiral-out and spiral-in pattern as shown in FIG. 4.

Continuing with FIG. 1, volume 142 is shown as the area within magnet assembly 141 for receiving subject 200 and includes a patient bore. As used herein, the usable volume of a MRI scanner is defined generally as the volume within volume 142 that is a contiguous area inside the patient bore where homogeneity of main, gradient and RF fields are within known, acceptable ranges for imaging.

A transceiver module 150 in the system control 122 produces pulses that are amplified by a RF amplifier system 151 and coupled to the RF coil system 152 by a transmit/receive switch system 154. The resulting signals radiated by the excited nuclei in the subject 200 may be sensed by the same RF coil system 152 and coupled through the transmit/receive switch system 154 to a preamplifier system 153.

The amplified MR signals are demodulated, filtered, and digitized in the receiver section of the transceiver 150. The transmit/receive switch 154 is controlled by a signal from the pulse generator module 121 to electrically connect the RF amplifier system 151 to the coil system 152 during the transmit mode (i.e., during excitation) and to connect the preamplifier system 153 during the receive mode. The transmit/receive switch system 154 also enables a separate RF coil (not shown, for example, a head coil or surface coil) to be used in either the transmit or receive mode.

During the transmission mode, the RF pulse waveforms produced by the pulse generator module 121 are applied to the RF amplifier system 151 comprised of multiple amplifiers. Each amplifier controls the current in a corresponding component coil of the coil system 152 in accordance with the amplifier's input RF pulse waveform. With the transmit/receive switch system 154, the RF coil system 152 is configured to perform transmission only, or alternatively, configured to additionally act as a receive coil array during the receive mode.

As used herein, "adapted to", "configured" and the like refer to mechanical or structural connections between elements to allow the elements to cooperate to provide a described effect; these terms also refer to operation capabilities of electrical elements such as analog or digital computers or application specific devices (such as an application specific integrated circuit (ASIC)) that is programmed to perform a sequel to provide an output in response to given input signals.

The MR signals picked up by the RF coil system 152 or a separate receive coil (not shown, for example, a body, head or surface coil) are digitized by the transceiver module 150 and transferred to a memory module 160 in the system control 122. When the scan is completed and an entire array of data has been acquired in the memory module 160, an array processor 161 operates to Fourier transform the data into an array of image data. These image data are conveyed through the serial link 115 to the computer system 107 where they are stored in the disk memory 111.

In response to commands received from the operator console 100, these image data may be archived on the tape drive 112, or they may be further processed by the image processor 106 and conveyed to the operator console 100 and presented on the display 104. Further processing is performed by the image processor 106 to reconstruct an image using acquired MR image data. It is to be appreciated that a MRI scanner is designed to accomplish field homogeneity with given scanner requirements of openness, speed and cost.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A magnetic resonance imaging (MRI) system comprising:
   radio frequency (RF) transmit coils and first and second gradient coils, wherein the RF transmit coils are arranged spatially distinct from each other and induce a nuclear magnetic resonance (NMR) excitation that is selective in a chemical-shift spectrum in response to radio frequency (RF) pulses, the first gradient coil produces a first magnetic field gradient along a first spatial-frequency axis in response to first gradient pulses, the second gradient coil produces a second magnetic field gradient along a second spatial-frequency axis in response to second gradient pulses, the NMR excitation is selective in first and second spatial dimensions due to the first and second magnetic field gradients, and the RF pulses are applied concurrently with the first and second gradient pulses during the NMR excitation.

2. The MRI system of claim 1, wherein the first and second gradient pulses have different waveforms.

3. The MRI system of claim 1, wherein the NMR excitation accelerates k-space sampling along two spatial-frequency axes.

4. The MRI system of claim 1, wherein the NMR excitation accelerates k-space sampling along three spatial-frequency axes.

5. The MRI system of claim 1, wherein the NMR excitation accelerates k-space sampling along a k-space sampling trajectory that comprises a repeated spiral-out and spiral-in pattern.

6. The MRI system of claim 1, wherein the NMR excitation is simultaneously selective in two spatial dimensions and one frequency dimension.

7. The MRI system of claim 1, wherein the NMR excitation is simultaneously selective in three spatial dimensions and one frequency dimension.

8. The MRI system of claim 1, wherein the RF pulses and the first and second gradient pulses reduce k-space sampling density during the NMR excitation.

9. The MRI system of claim 8, wherein the reduced sampling density results in a reduced pulse length of the NMR excitation.

10. The MRI system of claim 9, wherein a k-space sampling trajectory comprises a repeated spiral-out and spiral-in pattern during the NMR excitation.

11. A method for magnetic resonance imaging (MRI), the method comprising:
    applying current pulses concurrently to multiple transmit coils and multiple gradient coils to induce a nuclear magnetic resonance (NMR) excitation over a selected spatial region of an object and a selected band of resonance frequencies, wherein the multiple gradient coils produce multiple magnetic field gradients that oscillate along multiple spatial-frequency axes during the NMR excitation to generate at least one image of the spatial region in response to the NMR excitation.

12. The method of claim 11, further comprising applying different current pulse waveforms to the multiple gradient coils during the NMR excitation.

13. The method of claim 11, further comprising accelerating k-space sampling along two spatial-frequency axes during the NMR excitation.

14. The method of claim 11, further comprising accelerating k-space sampling along three spatial-frequency axes during the NMR excitation.

15. The method of claim 11, further comprising k-space sampling along a k-space sampling trajectory that comprises a repeated spiral-out and spiral-in pattern during the NMR excitation.

16. The method of claim 11, wherein the NMR excitation is simultaneously selective in two spatial dimensions and one frequency dimension.

17. The method of claim 11, wherein the NMR excitation is simultaneously selective in three spatial dimensions and one frequency dimension.

18. The method of claim 11, further comprising reducing k-space sampling density during the NMR excitation.

19. The method of claim 18, wherein a k-space trajectory assumes a repeated spiral-out and spiral-in pattern during the NMR excitation.

20. The method of claim 11, wherein the selected band of resonance frequencies is a chemical-shift spectrum.

21. A method of magnetic resonance imaging (MRI), the method comprising:

inducing nuclear magnetic resonance (NMR) excitation over a selected spatial region of an object and a selected band of resonance frequencies, wherein the NMR excitation repeatedly traverses the spatial region in a spiral-out and spiral-in pattern, is induced in response to radio frequency pulses applied to multiple transmit coils and repeatedly traverses the spatial region along first and second spatial-frequency axes in response to first gradient pulses applied to a first gradient coil and second gradient pulses applied to a second gradient coil; and generating an image of the spatial region in response to the NMR excitation.

* * * * *